(12) United States Patent
Liu

(10) Patent No.: US 9,017,562 B2
(45) Date of Patent: *Apr. 28, 2015

(54) PARTICLE SOURCES AND METHODS FOR MANUFACTURING THE SAME

(71) Applicant: 38th Research Institute, China Electronics Technology Group Corporation, Hefei, Anhui (CN)

(72) Inventor: Huarong Liu, Anhui (CN)

(73) Assignee: 38th Research Institute, China Electronics Technology Group Corporation, Heifei, Anhui (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/726,971

(22) Filed: Dec. 26, 2012

(65) Prior Publication Data

US 2013/0112138 A1 May 9, 2013

Related U.S. Application Data

(63) Continuation-in-part of application No. PCT/CN2012/076827, filed on Jun. 13, 2012.

(51) Int. Cl.
*C25F 3/00* (2006.01)
*C03C 15/00* (2006.01)
(Continued)

(52) U.S. Cl.
CPC ... *C23F 4/02* (2013.01); *H01J 1/00* (2013.01); *B82Y 99/00* (2013.01); *H01J 1/3044* (2013.01); *H01J 27/26* (2013.01); *H01J 9/025* (2013.01); *H01J 37/04* (2013.01); *H01J 37/06* (2013.01);
(Continued)

(58) Field of Classification Search
None
See application file for complete search history.

(56) References Cited

U.S. PATENT DOCUMENTS 7,368,727 B2 5/2008 Ward
2007/0025907 A1 2/2007 Rezeq et al.
(Continued)

FOREIGN PATENT DOCUMENTS

CN 101361154 A 2/2009
CN 101506927 A 8/2009
(Continued)

OTHER PUBLICATIONS

Machine Translation of JP 2011-238480 A.*
(Continued)

*Primary Examiner* — Shamim Ahmed
*Assistant Examiner* — Bradford Gates
(74) *Attorney, Agent, or Firm* — Merchan & Gould P.C.

(57) ABSTRACT

The present disclosure provides a method for manufacturing a particle source, comprising: placing a metal wire in vacuum, introducing active gas and catalyst gas, adjusting a temperature of the metal wire, and applying a positive high voltage V to the metal wire to dissociate the active gas at the surface of the metal wire, in order to generate at a peripheral surface of the head of the metal wire an etching zone in which field induced chemical etching (FICE) is performed; increasing by the FICE a surface electric field at the top of the metal wire head to be greater than the to evaporation field of the material for the metal wire, so that metal atoms at the wire apex are evaporated off; after the field evaporation is activated by the FICE, causing mutual adjustment between the FICE and the field evaporation, until the head of the metal wire has a shape of combination of a base and a tip on the base; and stopping the FICE and the field evaporation when the head of the metal wire takes a predetermine shape.

12 Claims, 4 Drawing Sheets

(51) Int. Cl.
    *C23F 4/02*     (2006.01)
    *H01J 1/00*     (2006.01)
    *H01J 1/304*     (2006.01)
    *H01J 9/02*     (2006.01)
    *H01J 37/04*     (2006.01)
    *H01J 37/06*     (2006.01)
    *H01J 37/08*     (2006.01)
    *B82Y 99/00*     (2011.01)
    *H01J 27/26*     (2006.01)
    *H01J 37/073*     (2006.01)

(52) U.S. Cl.
    CPC ............... *H01J 37/073* (2013.01); *H01J 37/08* (2013.01); *H01J 2237/0807* (2013.01); *H01J 2201/30415* (2013.01)

(56) References Cited

U.S. PATENT DOCUMENTS

| | | | |
|---|---|---|---|
| 2009/0110951 A1 | 4/2009 | Kuo et al. | |
| 2009/0160307 A1 | 6/2009 | Veda et al. | |
| 2010/0127170 A1 | 5/2010 | Fujita et al. | |

FOREIGN PATENT DOCUMENTS

| | | | |
|---|---|---|---|
| EP | 2 629 316 A1 | 8/2013 | |
| JP | 58-085242 A | 5/1983 | |
| JP | 7-192669 A | 7/1995 | |
| JP | 2004-214336 A | 7/2004 | |
| JP | 2009-107105 A | 5/2009 | |
| JP | 2009-541966 A | 11/2009 | |
| JP | 2009-301920 A | 12/2009 | |
| JP | 2011-082056 A | 4/2011 | |
| JP | 2011-124099 A | 6/2011 | |
| JP | 2011-238480 A | 11/2011 | |
| JP | 2013-528914 A | 7/2013 | |
| JP | 2013-0528915 A | 7/2013 | |

OTHER PUBLICATIONS

International Search Report for corresponding International Patent Application No. PCT/CN2012/076827 mailed Sep. 27, 2012.
Mulson, J.F. et al. "Corrosion of Tungsten and Iridium by Field Desorption of Nitrogen and Carbon Monoxide", The Journal of Chemical Physics, vol. 38, 1963, pp. 2615-2619.
Tsong, T. "Atom-Probe Field Ion Microscopy", Cambridge University Press, Cambridge, 1990, pp. 110-115.
Extended European Search Report for corresponding European Patent Application No. 12798587.7 mailed May 27, 2013.
Rahman, F. et al. "Field-assisted oxygen etching for sharp field-emission tip", Surface Science, vol. 602, No. 12, Jun. 15, 2008, pp. 2128-2134.
Bassett, D.W. "The enhancement by inert gases of the field desorption of oxygen from tungsten", British Journal of Applied Physics, vol. 18, No. 12, Dec. 1, 1967, pp. 1753-1761.
Onoda, J. et al. "STEM observation of tungsten tips sharpened by field-assisted oxygen etching", Surface Science, vol. 604, No. 13-14, Jul. 1, 2010, pp. 1094-1099.
Cranstoun, G. et al. "Hydrogen promoted corrosion of tungsten by oxygen in an electric field: A field ion mocroscope study", Surface Science, vol. 35, Mar. 1, 1973, pp. 319-335.
Rezeq, M. et al. "Tungsten nanotip fabrication by spacially controlled field-assisted reaction with nitrogen", Journal of Chemical Physics, vol. 124, May 31, 2006, pp. 204716-1.
Japanese Office Action for corresponding Japanese Patent Application No. 2013-520965 mailed Jan. 7, 2014; English translation included.
European Office Action for corresponding European Patent Application No. 12798587.7 mailed Apr. 11, 2014.
Chinese Office action for corresponding Chinese Patent Application No. 201110175692.X mailed Aug. 28, 2014.
European Office Action for corresponding European Patent Application No. 12798587.7 mailed Oct. 6, 2014.

* cited by examiner

PARTICLE SOURCES AND METHODS FOR MANUFACTURING THE SAME

This application claims priority to International Patent Application No. PCT/CN2012/076827, filed 13 Jun. 2012, which claims benefit of Ser. No. CN201110175692.X, filed 22 Jun. 2011 in China and which applications are incorporated herein by reference. To the extent appropriate, a claim of priority is made to each of the above disclosed applications.

TECHNICAL FIELD

The present disclosure relates to particle sources, and in particular to particle sources for electronic microscope, focused ion beam, micro-focus X-ray tube, electron beam lithography machine, ion beam lithography machine and the like, and methods for manufacturing the particle source. The present disclosure also relates to a device using the particle source.

BACKGROUND

Electronic microscope, focused ion beam, micro-focus X-ray tube, electron beam lithography machine, ion beam lithography machine and the like each play an important role in current micro- and nano-science and technology.

Electron source for generating electrons and ion source for generating ions (collectively referred to as particle source, which is usually formed of a metal wire) are key components in the above-mentioned imaging systems. The performance of the particle source is ultimately important to some critical characteristics of the imaging systems, such as resolution, or contrast.

The most common electron source is Schottky field emission electron source, which has advantages including a long life time over a conventional thermal electron source. However, this electron source also has some disadvantages, such as larger virtual source diameter, lower resolution and brightness, and uneven distribution of electron energy. Cold field emission electron source is currently considered as having a better performance in that it has a smaller virtual source diameter, and provides a higher brightness at high voltages than the Schottky field emission electron source. The brightness, however, would deteriorate dramatically at low voltages. This is not suitable for detection of many materials, particularly biological samples, which must be detected at a low voltage, otherwise would be damaged.

Gas field ion source has been introduced for many years. It has advantages, such as smaller virtual source diameter and uniform distribution of ion energy, and also disadvantages like lower beam current density. In addition, the size of tip is limited by micro- and nano-fabrication processes, and thus the divergence angle of an ion source is too large to be applied in a focused ion beam system. Currently, the most common ion source is liquid metal ion source which has a high beam current density but a larger virtual source diameter and uneven distribution of ion energy. Recently, with successful development of pyramid atom-level tip, it is possible for gas field ion source to be applied in focused ion beam systems. However, the shortcoming of a very low beam current density is still a restriction on application of the gas field ion source, especially in the field of micro- and nano-manufacture.

There is thus a need for a particle source capable of providing particle beam with high beam current density, small beam opening angle, reduced virtual source diameter and small energy spread. It is also desirable that an electron source could emit electron beams with good spatial coherence.

SUMMARY

The present disclosure is provided to solve at least one problem of the prior art. The present disclosure will be described in detail with reference to exemplary embodiments. However, the present disclosure is not limited to the embodiments.

According to an aspect of the present disclosure, a method for manufacturing a particle source is provided comprising: placing a metal wire in vacuum, introducing active gas and catalyst gas, adjusting a temperature of the metal wire, and applying a positive high voltage V to the metal wire to dissociate the active gas at the surface of the metal wire, in order to generate at a peripheral surface of the head of the metal wire an etching zone in which field induced chemical etching (FICE) is performed; increasing by the FICE a surface electric field at the top of the metal wire head to be greater than a field evaporation electric field of material for the metal wire, so that metal atoms at the top of the metal wire are evaporated off; after the field evaporation is activated by the FICE, causing mutual adjustment between the FICE and the field evaporation, until the head of the metal wire has a shape of combination of a base and a tip on the base; and stopping the FICE and the field evaporation when the head of the metal wire takes a predetermine shape.

In an embodiment, the catalyst gas may have a first ionization energy smaller than that of the active gas.

In an embodiment, the positive high voltage V may enable a surface electric field at the top of the head of the metal wire to be greater than an ionization electric field of the active gas.

In an embodiment, the active gas may have a pressure lower than a discharge pressure of the active gas, and the catalyst gas has a pressure lower than a discharge pressure of the catalyst gas.

In an embodiment, during the FICE, the temperature of the metal wire may be controlled so that the molecules of the active gas are adsorbed to the surface of the metal wire.

In an embodiment, the FICE and the field evaporation may be stopped when a tip is obtained having a predetermined number of atoms at the topmost layer.

In an embodiment, the method may further comprise: decreasing a migration rate of the active gas along the surface of the metal wire by quickly lowering the temperature of the metal wire to below the boiling point of the active gas, and then stopping the FICE and the field evaporation by turning off the positive high voltage V.

In an embodiment, the method may further comprise stopping the FICE and the field evaporation by stopping introduction of the catalyst gas.

In an embodiment, the method may further comprise stopping the FICE and the field evaporation by stopping introduction of the active gas.

In an embodiment, the method may further comprise: after stopping the FICE and the field evaporation and discharging the active gas and the catalyst gas, applying another positive high voltage to activate field evaporation at the topmost layer of the surface of the tip to remove non-metal atoms or molecules adsorbed at the tip, and also to selectively remove metal atoms in order to produce a tip having a predetermined number of atoms at the topmost layer.

In an embodiment, the predetermined number may be at least one.

In an embodiment, a micro-channel plate (MCP) and a conductive phosphor screen may be positioned in this order along a direction perpendicular to an axis of the metal wire and directly facing the head of the metal wire, and imaging gas may be injected for observing states of the head of the metal wire.

In an embodiment, the particle source may be an electron source or an ion source.

In an embodiment, the positive high voltage V may be constant while the FICE and the field evaporation are occurring simultaneously and adjusting each other.

In an embodiment, the base and the tip may both be symmetric about an axis.

In an embodiment, the metal wire may be preprocessed to have a tapered head with a tip diameter smaller than 1 μm.

In an embodiment, accuracy and speed of the FICE may be controlled by adjusting one or more of the pressure of the active gas, the temperature of the metal wire and the value of the positive high voltage V.

In an embodiment, the curvature radius of the base may be controlled by controlling the curvature radius of the tip and the value of the positive high voltage V.

In an embodiment, the active gas may comprise any one of $O_2$, $N_2$, CO, $CO_2$, and other active gas containing oxygen or nitrogen, or combination thereof.

In an embodiment, the catalyst gas may comprise any one of Xe, $CH_4$, $O_2H_4$, $C_2H_6$, $C_2H_2$, or combination thereof.

In an embodiment, the metal wire may comprise refractory metal having a melting point above 2200° C., or inert metal having high chemical inactivity.

In an embodiment, the metal wire may comprise any one of tungsten (W), tantalum (Ta), rhenium (Re), molybdenum (Mo), niobium (Nb), hafnium (Hf), iridium (Ir), osmium (Os), rhodium (Rh), ruthenium (Ru), platinum (Pt), palladium (Pd) and gold (Au).

In an embodiment, the value of the positive high voltage may have a range of 3 kV-100 kV.

In an embodiment, when the active gas is $O_2$, the active gas may have a pressure in a range of $10^{-6}$ Pa~$10^{-1}$ Pa; when the active gas is $N_2$, the active gas may have a pressure in a range of $10^{-6}$ Pa~$10^{-2}$ Pa; and when the active gas is CO, the active gas may have a pressure in a range of $10^{-6}$ Pa~$10^{-1}$ Pa.

In an embodiment, when the active gas is $O_2$, the temperature of the metal wire may be in a range of 10K~200K; when the active gas is $N_2$, the temperature of the metal wire may be in a range of 10K~200K; and when the active gas is CO, the io temperature of the metal wire may be in a range of 10K~200K.

According to another aspect of the present disclosure, a particle source is provided comprising: a base having a gently-curved top; and a tip formed as a tiny protrusion on the top of the base, wherein the material of the particle source is inert metal.

According to another aspect of the present disclosure, a particle source is provided being manufactured with a method of any one of the above methods.

According to a further aspect of the present disclosure, an apparatus is provided comprising the particle source as mentioned above. The apparatus may be an electronic microscope, a focused ion beam, a micro-focus X ray tube, an electron beam lithography machine, an ion beam lithography machine and the like.

BRIEF DESCRIPTION OF THE DRAWINGS

The above features and advantages of the present disclosure will be more apparent from the following detailed description with reference to accompanying drawings. The figures are intended to be illustrating, other than limiting, the present disclosure. The figures may not be drawn to scale, and the shapes are also illustrative, rather than strictly corresponding to those of products. In the figures.

DETAILED DESCRIPTION OF THE PREFERRED EMBODIMENTS

Hereafter, embodiments of the present disclosure will be described in detail with reference to the figures. It will be readily understood that the following detailed description of embodiments is exemplary rather than exclusive. They are intended to illustrate the principle of the present disclosure, rather than limit the scope of the present disclosure.

Figure 1:
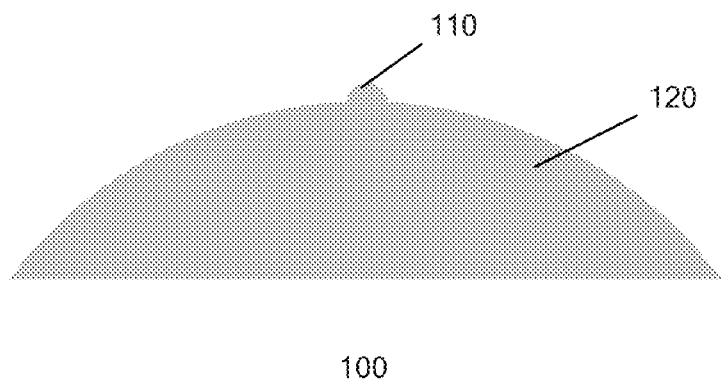
FIG. 1 shows a schematic structure diagram of a particle source according to an embodiment of the present disclosure.

FIG. 1 shows a schematic structure diagram of a particle source 100 according to an embodiment of the present disclosure. The particle source 100 may be used as electron or ion source.

As shown in FIG. 1, the particle source 100 may include a tip 110 and a base 120. The tip 110 may be formed as a tiny protrusion on the base 120. The curvature radius of the top of the tip 110 may be of an order ranging from sub-nanometers to tens of nanometers. There may exist at least one atom at the topmost layer of the top of the tip 110. The top of the base 120 may be formed as a gently-shaped convex, and optionally may be symmetric about a central axis of the base 120. Optionally, the curvature radius of the base 120 may be of an order ranging from tens of nanometers to micrometers. Optionally, the tip 110 may be positioned exactly at the center of the base 120. The curvature radius of the base 120 is substantially greater than that of the tip 110. According to an embodiment of the present disclosure, the curvature radiuses of the base 120 and the tip 110 may have a ratio greater than 3:1.

By having a tiny tip formed on a relatively larger base, the particle source 100 may produce lens effect, and thus obtain a very small beam opening angle. According to an embodiment of the present disclosure, beams of particles may be constrained within a very narrow beam opening angle, and this may greatly increase the beam current density.

The particle source having the above configuration, when used as an electron source, may give an improved evenness of electron energy, because the source has high utilization of current, and reduced total amount of charges and thus Coulomb repulsion force in a space. Optionally, when the particle source having the above configuration is used as an electron source, there may be only one atom at the topmost part of the tip 110. In this way, the generated electron beam may have good coherence among electrons.

Figures 2A, 2B:
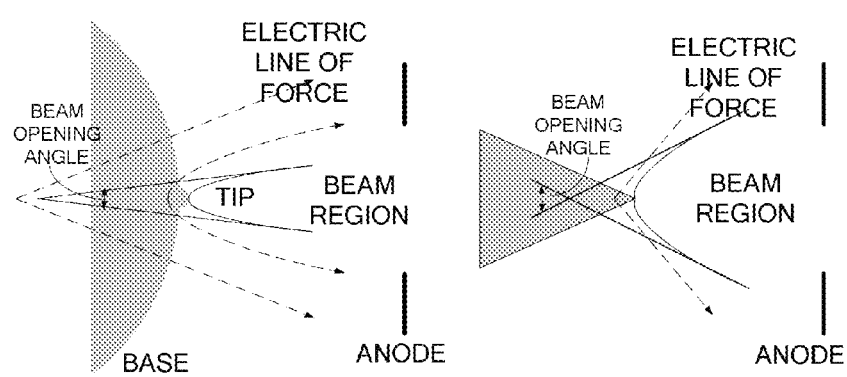
FIGS. 2A and 2B show schematic diagrams of a particle source according to an embodiment of the present disclosure and a prior art pyramid-shaped particle source when they are used as an electron source, respectively.

FIGS. 2A and 2B show schematic diagrams of the particle source 100 according to an embodiment of the present disclosure and a prior art pyramid-shaped particle source (U.S. Pat. No. 7,368,727 B2) when they are each used as an electron source. It can be seen that the beam opening angle of the particle source 100 is far smaller than that of the pyramid-shaped particle source, and accordingly the former may have a far greater proportion of current through an extraction electrode than the latter.

Figures 2C, 2D:
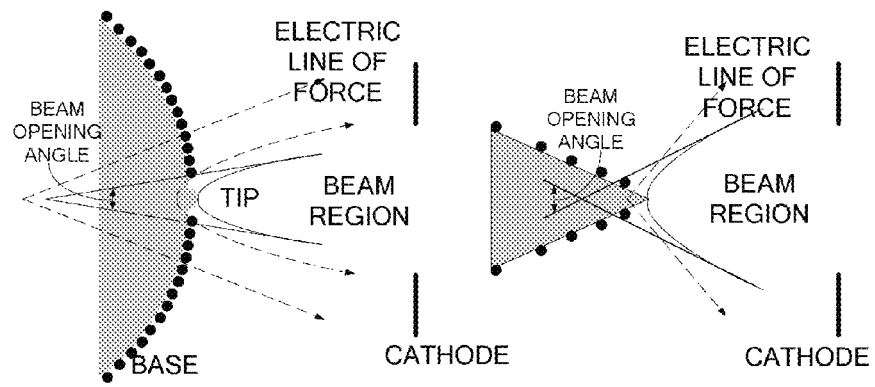
FIGS. 2C and 2D show schematic diagrams of a particle source according to an embodiment of the present disclosure and a prior art pyramid-shaped particle source when they are used as an ion source, respectively.

The particle source having the above configuration when used as an ion source may achieve a large current, because the base has a relatively large surface area, and may attract more gas to be provided to the tip. FIGS. 2C and 2D show schematic diagrams of the particle source 100 according to an embodiment of the present disclosure and the prior art pyramid-shaped particle source when o they are each used as an ion source. It can be seen that with a comparative size, the particle source 100 may have a much larger base surface area than the pyramid-shaped particle source, and therefore may attract more gas for generating greater ion current.

The particle source usually operates in a very strong electric field. In order to reduce negative effect of the strong electric field on the tip, the tip may be made of refractory metal (e.g., those having a melting point above 2200° C.) having an intensive electric field of field evaporation, e.g., tungsten (W), tantalum (Ta), rhenium (Re), molybdenum (Mo), niobium (Nb), or hafnium (Hf). However, in practice, the lifetime and stability of such a tip will still be affected by certain disadvantageous factors, which will be discussed here with respect to electron source and ion source, respectively.

Firstly, when the particle source is used as an inert gas ion source, a positive bias voltage is applied to the particle source, and the electric field at the tip is greater than tens V/nm. Under such a strong electric field, the active gas molecules in vacuum are ionized directly before they reach the tip surface and cannot affect the tip. However, these molecules may attach to the peripheral surface of the base and etch the base under the strong electric field. As a result, the shape of the base may gradually change and finally the tip is damaged. Generally when the vacuum is about $10^{-8}$ Pa, the lifetime of the particle source of the refractory metal is about 200 hours.

Secondly, particle sources made of inert metal such as iridium (Ir), osmium (Os), rhodium (Rh), ruthenium (Ru), platinum (Pt), palladium (Pd) or gold (Au) are highly desired because these inert metals are highly resistant to corrosion induced by active gases. These particle sources can be used as ideal electron sources of high stability and long lifetime. Moreover, because iridium (Ir), osmium (Os), rhodium (Rh), and ruthenium (Ru), etc. are highly resistant to corrosion of many active gases (e.g., $N_2$ or $O_2$) at a low temperature in an intensive electric field, they are ideal materials for the point active ion source.

Hereafter, a method for manufacturing a particle source using inert metal will be described with reference to an embodiment of the present disclosure.

Figure 3A:
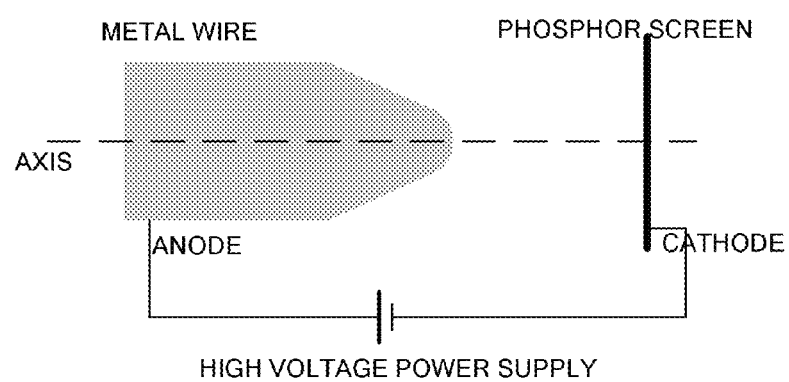
FIG. 3A shows a schematic diagram of an apparatus for manufacturing a particle source according to an embodiment of the present disclosure.

FIG. 3A shows a schematic diagram of an apparatus for manufacturing a particle source according to an embodiment of the present disclosure. As shown in FIG. 3A, a metal wire is placed in a vacuum chamber and is cooled. Then, active gas and catalyst gas are introduced into the chamber. Finally, positive high voltage V is applied to the metal wire.

The metal wire may be made of metals with high chemical inactivity, such as iridium (Ir), osmium (Os), rhodium (Rh), ruthenium (Ru), platinum (Pt), palladium (Pd) or gold (Au). The cooled metal wire may adsorb the active gas at its surface. The temperature can be adjustable so that an etching zone (described later) of a appropriate width appears on the tip. The active gas may be any one of $O_2$, $N_2$, CO, $CO_2$, other active gas containing oxygen or nitrogen, or combination thereof.

The partial pressure of active gas is adjustable so that the FICE may be performed with an appropriate reaction rate. Notes that the partial pressure of active gas should be less than its discharge pressure. The positive high voltage V should be adjusted so that the electric field at the apex of the metal wire is larger than the ionization field of the active gas, and accordingly produce an etching zone (described later) at a predetermined position of the metal wire.

As shown in FIG. 3A, the metal wire head (including the base and the tip) may optionally have an axisymmetric shape. The metal wire may be pre-processed, for example, by electrochemical etching, to have a tapered head, which has a size of a micron or submicron order. For etching processes of different metal wires, reference may be made to Tsong, T. T. *Atom-Probe Field Ion Microscopy* (Cambridge University Press: Cambridge, 1990).

The method for manufacturing a particle source according to an embodiment of the present disclosure is a process which combines FICE and field evaporation in a simultaneous manner. The positive high voltage V produces an etching zone at the metal wire head, and FICE is performed within this etching zone. The FICE increases an electric field at the apex of the metal wire to be greater than an the is electric field for field evaporation of the metal material, so that the metal atoms at the top surface may be evaporated off. After the FICE activates the field evaporation, the positive high voltage V may be preferably constant, and thus allow mutual adjusting between the FICE and the field evaporation to achieve and maintain a dynamically balanced state. Under such condition, the shape of the metal wire head is continuously changed, until the head becomes a large base with a tiny tip on it. The FICE occurs at the peripheral surface of the metal wire head to form the base. The FICE and the field evaporation respectively reduce the head of the metal wire from the lateral side and the upper side to form the tip. With the above manufacturing method, it is possible to achieve an atom-level accurate control for the tip curvature radius, and a nanometer-level accurate control for the base curvature radius.

It is known that some active gases (e.g., $O_2$ or $N_2$) may not etch inert metal such as iridium (Ir) directly in an strong electric field at low temperature. However, such active gas can etch the metal with strong electric field if it is dissociated into atoms or ions at the metal surface with the assistance of catalyst gas. For convenience of explanation, the dissociation products of the active gas are also referred to as "active gas". Those skilled in the art will understand that in the following description on etching process, the "active gas" that functions in the etching also refers to the dissociation products of the active gas.

Figure 3B:
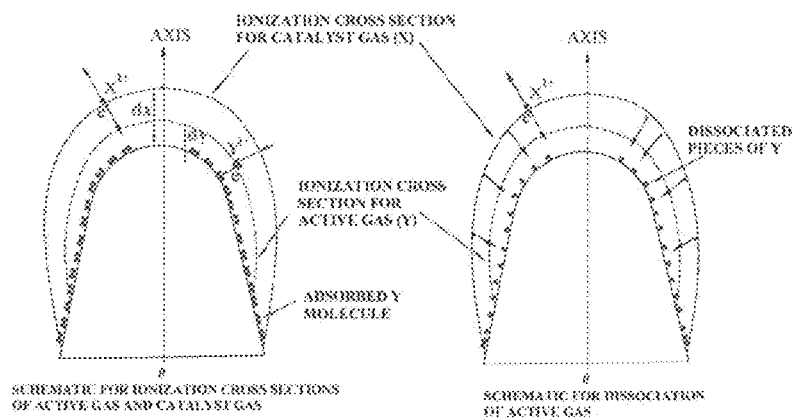
FIG. 3B shows a schematic diagram for illustrating a principle in selecting active gas and catalyst gas.

The role of catalyst gas (X) is to provide high-energy electrons to bombard the active gas (Y) adsorbed by the surface so as to dissociate Y. Generally the active gas may have a dissociation energy of several eVs. FIG. 3B shows a schematic diagram illustrating the rule to select the pair of X and Y. X should have a first ionization energy smaller than that of Y. Correspondingly, the first ionization cross section for X locates at the outside of that for Y referring to the wire surface. If the distances between the ionization cross sections and the wire surface are denoted as dx and dy for X and Y, respectively, electrons emitted from X and Y should have energies of eFdx and eFdy, respectively, when they reach the wire surface. Here e is the charge on the electron, and F refers to the strength of the surface electric field. Because dx is greater than dy, eFdx is greater than eFdy. I.e, dx should be selected to be as large as possible so that the electrons will have sufficient energy to bombard the adsorbed active gas of Y so as to dissociate it. The dissociation effect is shown in FIG. 3B.

Meanwhile, because the first ionization cross section of X is outside that of Y, dissociation of Y may occur in a large region near the surface of the wire head.

In selecting the catalyst gas, its boiling point should also be considered. Because the FICE is generally performed at low temperature (from 10K to room temperature), the catalyst gas may condense at the wire surface, and then deteriorate the adsorption of the active gas therefore the etching effect if the catalyst gas has a high boiling point,. Therefore, the catalyst gas should have a sufficiently low boiling point. If the active gas is $O_2$, $N_2$, CO, $CO_2$, or $H_2O$, the corresponding catalyst gas may be Xe, $CH_4$, $C_2H_2$, $C_2H_4$, $C_2H_6$, or $C_2H_2$, etc. Relevant physical parameters of these gases are shown in Table 1.

Because most organic gas may decompose to be carbon and so on, and therefore contaminate the vacuum chamber, the catalyst gas may preferably be Xe or $CH_4$.

Table 1 shows the boiling points and ionization energies of different active gases.

TABLE 1

| GAS | BOILING POINT (K) | FIRST IONIZATION ENERGY(eV) |
| --- | --- | --- |
| $O_2$ | 90.33 | 13.6 |
| $N_2$ | 77.5 | 14.6 |
| CO | 112 | 14.1 |
| $H_2O$ | 373 | 12.6 |
| $CO_2$ | 77.5 | 14.6 |

Table 2 shows boiling points and ionization energies of different catalyst gases.

TABLE 2

| GAS | BOILING POINT (K) | FIRST IONIZATION ENERGY(eV) |
| --- | --- | --- |
| $CH_4$ | 112 | 12.6 |
| Xe | 165.18 | 12.13 |
| $C_2H_4$ | 169.5 | 11.1 |
| $C_2H_6$ | 184 | 11.5 |
| $C_2H_2$ | 189 | 11.41 |

The FICE process will be explained first with reference to FIG. 4A. The wire may be cooled and placed in a space filled with active gas. A positive high voltage V may be applied to the wire to generate a strong electric field at the wire tip. Catalyst gas is then introduced to dissociate the active gas adsorbed by the wire surface into dissociation products such as atoms or ions.

The distribution of the active gas at metal wire surface strongly depends on the electric field strength. If the local field at some regions exceeds the ionization field strength ($E_1$) for the active gas, it will be ionized at a distance (about 0.4 nm) from the surface, and thus cannot reach these regions directly from the vacuum. Therefore, active gas can reach these regions only by field-induced immigration. That is, the active gas is firstly adsorbed at the surface positions with low field strength and then move along the surface to high-strength positions. Such active gas is closely proximate (within 0.4 nm) to the surface, and cannot be ionized. During the immigration of the active gas toward the apex of the tip, the active gas is constantly consumed, because the FICE is activated wherever the surface field exceeds the threshold field strength $E_C$ for FICE, which causes the consumption of the active gas. As a result, the concentration of active gas at the wire surface decreases with an increase on the electric field, i.e. it decreases from the shank to the apex. Here, the position with a field of $E_C$ is referred to the low limit of FICE while the up limit of FICE corresponds to the up limit of the distribution of active gas along the surface, where the local field strength is denoted as $E_{up}$. The region between the positions with $E_C$ and $E_{up}$ is here defined as an etching zone. Note that $E_C$ depends on the metal material and the composition of active gas.

The rate and accuracy of the FICE process are influenced by the amount of active gas adsorbed at the surface and the immigration rate of active gas along the surface.

The etching rate increases with the amount of active gas adsorbed at the surface. The greater the concentration of the introduced active gas (i.e., the greater the pressure) is, the more active gas is adsorbed at the metal wire surface, and the greater the etching rate is. In addition, it is easier for active gas to be adsorbed at the metal wire surface at a lower temperature. However, lowering the temperature may reduce the immigration rate of active gas along the surface, and thus reduce the etching rate. Further, it is easier for the metal wire surface to adsorb the active gas if the electric field at the surface is stronger. A person skilled in the art will appreciate that the etching accuracy may decrease at a higher etching rate. Therefore, the etching rate and accuracy may be regulated in accordance with practical applications by adjusting the active gas pressure, the metal temperature, and the value of the applied voltage.

The FICE rate increases with an increase in the immigration rate of active gas along the surface. The migration rate mainly relates to two factors. The first one is the gradient distribution of the electric field along the wire surface, which mainly depends on the surface geometry, the properties of wire material and the like. The second is the kinetic energy of active gas. The kinetic energy of active gas adsorbed at the surface may be changed by adjusting the wire temperature.

The lower the wire temperature is, the lower the migration rate of active gas is, and the narrower the etching zone is. Accordingly, the FICE accuracy become higher, but the etching rate is less. On the contrary, the higher the wire temperature, the wider the etching zone is. Accordingly, the etching accuracy will be reduced, but the etching rate is increased. Therefore, by controlling the wire temperature, it is possible to control the FICE with expected rate and accuracy.

Figure 4A:
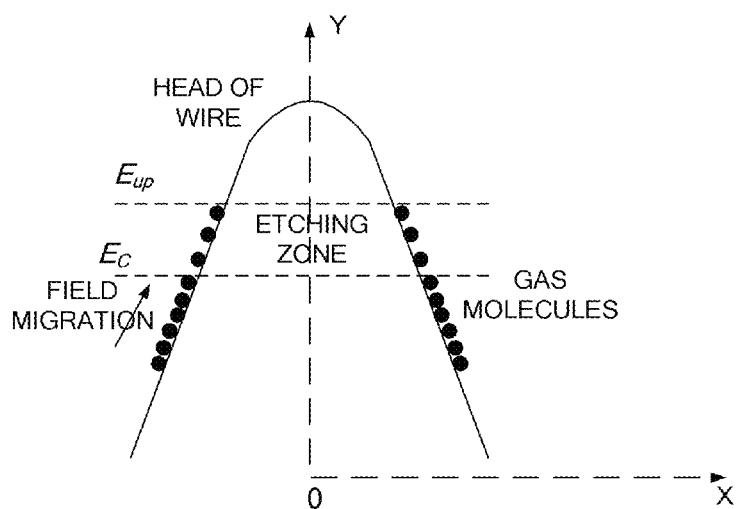
FIGS. 4A-4C show a method for manufacturing a particle source according to an embodiment of the present disclosure.
Figure 4B:
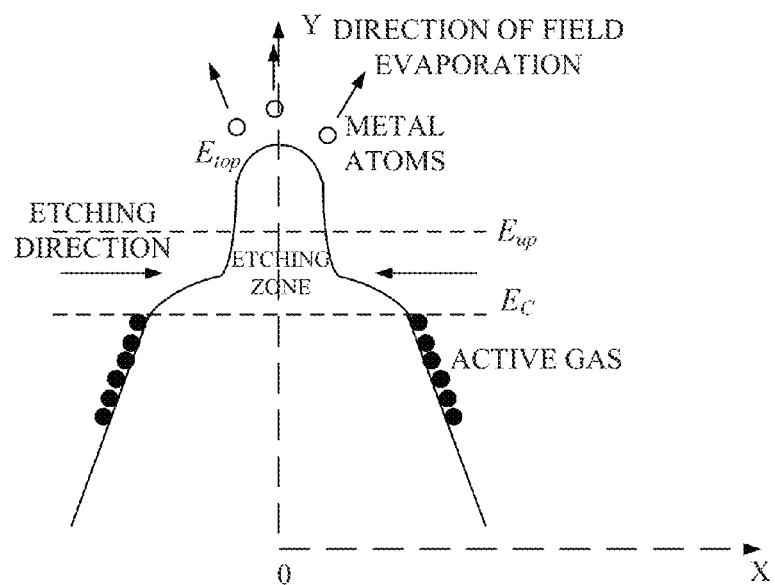

As shown in FIG. 4A, at the beginning of etching, a sufficiently high positive voltage V is applied to the wire so that the field strength at the wire apex exceeds the ionization field strength ($E_I$) for active gas, and thus there is no active gas at the apex. Accordingly, an etching zone will be formed at a distance from the wire apex. This high voltage may be adjustable according to the curvature radius of the wire apex. In an embodiment of the present disclosure, the positive high voltage V may be between 3 kV and 100 kV. During the process of etching, the active gas may continuously etch the peripheral surface of the metal wire, which will increase the curvature radius of the etching zone and then form a base with a gently-shape top as shown in FIG. 4B. Particularly in the FICE process, the active gas may be bound to atoms of metal surface, and reduce the binding energy between these surface atoms and their neighboring metal atoms. With the o assistance of the strong field, the composition of the active gas and the metal atoms are evaporated off from the surface. This process is called as FICE.

Next the field evaporation will be described with reference to FIG. 4B. Along with the occurrence of the FICE, the curvature radius of the metal apex above the etching zone is decreased so that the electric field $E_{top}$ at the apex is being increased. When $E_{top}$ is increased to be above the field evaporation field $E_p$ for the metal material, the apex metal atoms will be directly pulled out of the metal surface by the strong electric field. This process is called field evaporation. As a result, the FICE continuously reduces the metal wire apex from the peripheral surface, and the field evaporation continuously reduces the metal wire apex from the upper side.

Figure 4C:
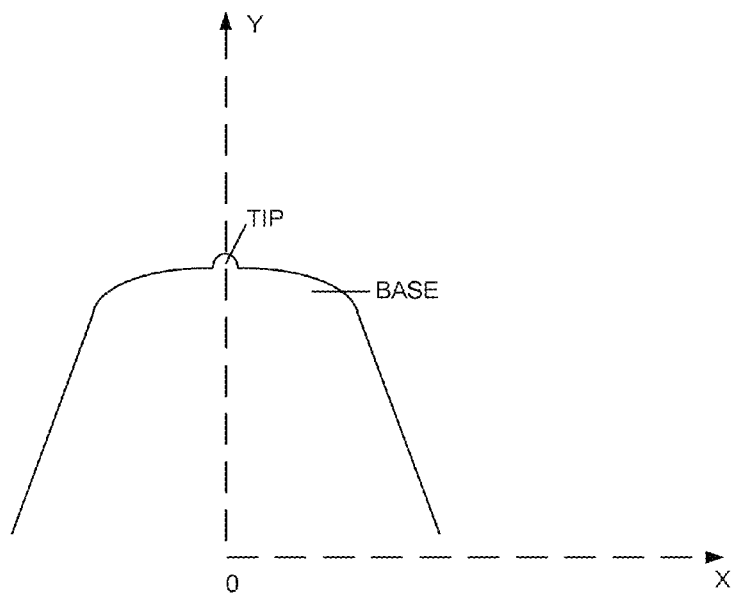

With the FICE and the field evaporation being performed, the apex of the metal wire is gradually decreased in size. When the apex is reduced into an expected shape, the FICE and the field evaporation are stopped, and a particle source having a large base and a tiny tip is obtained as shown in FIG. 4C. After stopping the FICE and the field evaporation and discharging the active gas, another positive high voltage may be applied to activate field evaporation at the topmost layer of the surface, which will remove remnant gas and any nonmetal atoms or molecules (e.g., the molecule of the active gas) adsorbed at the apex, and also selectively remove some metal atoms in order to produce a tip having a predetermined number of atoms at the topmost layer.

According to an embodiment of the present disclosure, when the wire apex having a desired shape is obtained, the immigration speed of the active gas along the metal wire surface may be optionally decreased by quickly lowering the wire temperature to below the boiling point of the active gas. Then, the positive high voltage may be turned off to stop the FICE and the field evaporation. At this time, even though the catalyst gas molecules are still being ionized to provide electrons, the etching of the tip is stopped due to lack of the active gas at the wire apex.

Optionally, introduction of the active gas may be stopped before lowering the temperature of the metal wire and turning off the positive high voltage.

Optionally, introduction of the catalyst gas may be stopped before lowering the temperature of the metal wire and turning off the positive high voltage.

After the positive high voltage is turned off, the wire temperature is increased to an appropriate temperature (e.g. above the boiling point of the gas and optionally being the room temperature), in order to remove the active gas molecules adsorbed at the surface.

According to an embodiment of the present disclosure, at a constant positive high voltage, mutual adjusting occurs between the FICE and the field evaporation to achieve and maintain a dynamically balanced state. The FICE leads to an increase in the curvature radius of the etching zone, and thus a decrease in the electric field. At the same time, the size of the central region of the head will be reduced, leading to reduction in the curvature radius and increase in electric field. This will finally activate the field evaporation. The field evaporation in turn increases the curvature radius of the size of the central region of the head, and decreases the size of the central region along a longitudinal direction. Since the surface electric field at the central region is always maintained at the field evaporation electric field $E_p$, the change in the geometry of the central region may narrow the difference of electric fields at the bottom and at the head. This may in turn lead to an increase in the electric field at the base. To be noted, the electric field at the base may have an overall tendency of gradual decreasing. When the electric field at some area of the base deceases to be less than $E_C$, the FICE is stopped in this area.

The processes of FICE and field evaporation may be observed by introducing imaging gas. As shown in FIG. 3A, a conductive phosphor screen may be positioned directly before the metal wire. The imaging gas may be inert gas, such as He, Ne and the like. Under a strong electric field generated by a high voltage, the molecules of the imaging gas may be polarized and attracted by the tip. Upon arriving at the head of the tip, the molecules may be ionized and then bombarded onto the phosphor screen. Such bombardment may generate bright spots on the screen, each spots for an image of one atom. In this way, the state of the metal wire head may be observed. According to an embodiment of the present disclosure, a micro-channel plate (MCP) may be positioned between the metal wire and the screen to facilitate the imaging process.

By observing the state of the metal wire head, it is possible to stop FICE and field evaporation at the exact time of achieving the desired shape of the particle source, and thus control the shape in a more accurate manner. According to an embodiment of the present disclosure, after stopping the FICE and field evaporation, only field evaporation may be used to accurately control the number of atoms at the topmost layer of the tip. In particular, a tip having only one atom at the topmost layer may be obtained, and an electron source with such a tip may have good spatial coherence. However, a person skilled in the art will appreciate that the above-mentioned observation process is not necessary to the present disclosure, and may be omitted if relevant process parameters could be experimentally determined.

According to an embodiment of the present disclosure, it is possible to accurately control the curvature radiuses of the tip and the base ($R_{Tip}$ and $R_{Base}$, respectively). As described above, the positive high voltage V is maintained at a constant value during the etching process. Once the FICE activates the field evaporation, a mutual adjustment between the FICE and the field evaporation is achieved. At this time, by observing and monitoring how the tip changes, it is possible to immediately stop the FICE and the field evaporation when the particle source has obtained a predetermined shape, and thus accurately control the curvature radius $R_{Tip}$ of the tip up to the atom level.

Once the field evaporation is started, the electric field $E_{top}$ at the topmost layer will be maintained at the evaporation field $E_p$ for the metal material. $E_p$ is a constant depending on material and crystallographic plane. For facilitating the description, a parameter, field enhancement factor β, may be introduced. The parameter β is commonly used in the field of field ion and field emission microscopes. The parameter β may be defined as $$E_{top}=E_P=V/\beta, \text{ that is, } \beta=V/E_P \tag{1}$$

β depends on a distance d from the tip to the phosphor screen, and the curvature radiuses of the tip and the base ($R_{Tip}$ and $R_{Base}$, respectively). β may be denoted as a function of $$\beta=\beta(d, R_{Base}, R_{Tip}) \tag{2}$$

In manufacture, the region where the FICE and the field evaporation occur may have a size of a micrometer order, which is substantially less than the value of d (of a centimeter order) in a conventional field ion microscope. Therefore, d may be considered as a constant value, and omitted from the above equation (2). Further, since $R_{Tip}$ is substantially less than $R_{Base}$, the equation (2) may be rewritten as $$\beta=\beta_1(R_{Base})/\beta_2(R_{Tip}) \tag{3}$$

$\beta_1(R_{Base})$ and $\beta_2(R_{Tip})$ are field enhancement factors for the base and the tip and depend on their curvature radiuses, respectively.

By combining the equations (1) and (3), it may be derived as $$\beta_1(R_{Base}) = \frac{V}{E_P \times \beta_2(R_{Tip})} \quad (4)$$

As above described, it is possible to accurately control $R_{Tip}$ and thus $\beta_2(R_{Tip})$, and $E_p$ depends on the material. Therefore, $\beta_1(R_{Base})$ and thus $R_{Base}$ may be accurately controlled by adjusting the value of the voltage V.

The method provided by the present disclosure can be used to etch metal wires of other materials, such as refractory metal including tungsten (W), tantalum (Ta), rhenium (Re), molybdenum (Mo), and hafnium (Hf).

The active gas and catalyst gas may be properly selected for different metals. For example, $N_2$ may have a much better etching effect on Pt than $O_2$. Therefore, $N_2$ can be used in etching Pt.

For any material, the positive high voltage is controlled so that the surface field at the apex of the metal wire is stronger than the ionization electric field of the active gas. The pressure of the active gas is controlled to be lower than the discharging pressure of the active gas. The pressure of the catalyst gas is controlled to be lower than the discharging pressure of the catalyst gas. The cooling temperature of the metal wire is controlled so that the active gas molecules can be adsorbed to the surface of the metal wire. Preferably, after the FICE and field evaporation are activated, the positive high voltage V is maintained at a constant value.

For example, in the case of active gas $O_2$, the pressure of the gas may be controlled in the range from $10^{-6}$ Pa to $10^{-1}$ Pa. For $N_2$, the pressure of the gas may be controlled in the range from $10^{-6}$ Pa to $10^{-2}$ Pa. For CO, the pressure of the gas may be controlled in the range from $10^{-6}$ Pa to $10^{-1}$ Pa.

For example, in the case of active gas $O_2$, the temperature of the metal wire may be controlled in the range from 10K to 200K. For $N_2$, the temperature of the metal wire may be controlled in the range from 10K to 200K. For CO, the temperature of the metal wire may be controlled in the range from 10K to 200K.

The positive high voltage V may take a value between 3 kV and 100 kV.

A person skilled in the art will appreciate that the above values or value ranges are alternative examples only for an easier understanding of the principle and process of the present disclosure, and the present disclosure may also be implemented with other values or value ranges in addition to these examples.

The method according to the present disclosure may be used in manufacturing an electron source for electronic microscope, an ion source for ion microscope, an electron source for electron beam lithography machine, an ion source for ion beam lithography machine, an electron source for micro-focus X ray tube, and particle sources for other purposes. The method according to the present disclosure can accurately control the number of atoms at the tip of the particle source, and the number may reach a minimum of 1.

The method according to the present disclosure can produce a particle source capable of providing particle beam of high beam current density, small beam opening angle, reduced virtual source diameter and small energy spread. An electron source produced according to the present disclosure can emit electron beams with good spatial coherence.

The foregoing description illustrates the principle of the present disclosure with reference to exemplary embodiments. As will be appreciated by a person skilled in the art, the respective details listed above are intended for illustrating other than limiting the present disclosure. The steps included in the above method may be performed in different sequences, as long as the object of the present principle can be achieved. The scope of the present disclosure is defined by the appending claims and equivalents thereof.

What is claimed is:

1. A method for manufacturing a particle source, comprising:
   placing a metal wire in vacuum, introducing active gas and catalyst gas, adjusting a temperature of the metal wire, and applying a positive voltage V to the metal wire to ionize the active gas at the apex of the metal wire, in order to generate at a peripheral surface of the head of the metal wire an etching zone in which field induced chemical etching (FICE) is performed;
   increasing by the FICE a surface electric field at the apex of the metal wire to be greater than the evaporation field of the metal wire material, so that metal atoms at the apex of the metal wire are evaporated off;
   after the field evaporation is activated by the FICE, causing mutual adjustment between the FICE and the field evaporation, until the head of the metal wire has a shape of combination of a base and a tip on the base, wherein the positive voltage V is constant while the FICE and the field evaporation are occurring simultaneously and adjusting each other; and
   stopping the FICE and the field evaporation when the head of the metal wire takes a predetermine shape.

2. The method of claim 1, wherein the catalyst gas has a first ionization energy smaller than that of the active gas.

3. The method form claim 1, wherein the positive voltage V enables a surface electric field at the top of the head of the metal wire to be stronger than an ionization electric field of the active gas.

4. The method of claim 1, wherein during the FICE, the temperature of the metal wire is controlled so that the molecules of the active gas are adsorbed to the surface of the metal wire.

5. The method of claim 1, further comprising: when the tip is obtained having a predetermined number of atoms at the topmost layer, decreasing a migration rate of the active gas along the surface of the metal wire by lowering the temperature of the metal wire to below the boiling point of the active gas, and then stopping the FICE and the field evaporation by turning off the positive voltage V.

6. The method of claim 5, further comprising: after the positive voltage V is turned off, stopping introduction of the catalyst gas and the active gas and increasing the temperature of the metal wire to remove active gas molecules adsorbed at the surface of the metal wire, so as to stop the FICE and the field evaporation.

7. The method of claim 1, further comprising: after stopping the FICE and the field evaporation and discharging the active gas and the catalyst gas, applying another positive voltage to activate field evaporation at the topmost layer of the surface of the tip to remove non-metal atoms or molecules adsorbed at the tip, and also to selectively remove metal atoms in order to produce a tip having a predetermined number of atoms at the topmost layer, wherein the predetermined number is at least one.

8. The method of claim 1, wherein the positive voltage V ranges from 3kV to 100kV.

9. The method of claim 1, wherein accuracy and rate of the FICE is controlled by adjusting one or more of the pressure of the active gas, the temperature of the metal wire and the value of the positive voltage V.

10. The method of claim 1, wherein the curvature radius of the base is controlled by controlling the curvature radius of the tip and the value of the positive voltage V.

11. The method of claim 1, wherein the active gas comprises any one of $O_2$, $N_2$, CO, $CO_2$, and other active gas containing oxygen or nitrogen, or combination thereof; wherein the catalyst gas comprises any one of Xe, $CH_4$, $C_2H_4$, $C_2H_6$, $C_2H_2$, or combination thereof; and wherein the metal wire comprises any one of tungsten (W), tantalum (Ta), rhenium (Re), molybdenum (Mo), niobium (Nb), hafnium (Hf), iridium (Ir), osmium (Os), rhodium (Rh), ruthenium (Ru), platinum (Pt), palladium (Pd) and gold (Au).

12. The method according to claim 1, wherein the curvature radius of the base is of an order ranging from tens of nanometers to micrometers, and the curvature radius of the tip is of an order ranging from sub-nanometers to tens of nanometers.

\* \* \* \* \*